US010319534B2

(12) United States Patent
Yan et al.

(10) Patent No.: US 10,319,534 B2
(45) Date of Patent: Jun. 11, 2019

(54) PEROVSKITE THIN FILM LOW-PRESSURE CHEMICAL DEPOSITION EQUIPMENT AND USES THEREOF

(71) Applicant: Hangzhou Microquanta Semiconductor Co., Ltd., Hangzhou, Zhejiang (CN)

(72) Inventors: Buyi Yan, Hangzhou (CN); Jizhong Yao, Hangzhou (CN)

(73) Assignee: Hangzhou Microquanta Semiconductor Co., Ltd., Hangzhou (CN)

(*) Notice: Subject to any disclaimer, the term of this patent is extended or adjusted under 35 U.S.C. 154(b) by 0 days.

(21) Appl. No.: 15/944,694

(22) Filed: Apr. 3, 2018

(65) Prior Publication Data

US 2018/0233296 A1 Aug. 16, 2018

Related U.S. Application Data

(63) Continuation of application No. PCT/CN2017/082794, filed on May 3, 2017.

(30) Foreign Application Priority Data

Aug. 25, 2016 (CN) .......................... 2016 1 0722840

(51) Int. Cl.
*H01G 9/20* (2006.01)
*C23C 16/455* (2006.01)
(Continued)

(52) U.S. Cl.
CPC ........... *H01G 9/2059* (2013.01); *C23C 16/30* (2013.01); *C23C 16/4481* (2013.01);
(Continued)

(58) Field of Classification Search
CPC .... H01G 9/2059; H01G 9/204; H01G 9/2031; C23C 16/45591; C23C 16/4481;
(Continued)

(56) References Cited

U.S. PATENT DOCUMENTS

| 5,223,305 A | 6/1993 | Tanaka et al. |
| 2011/0097492 A1* | 4/2011 | Kerr ................... C23C 16/4401 427/248.1 |
| 2011/0312162 A1* | 12/2011 | Iacopi ................. C23C 16/4412 438/478 |

FOREIGN PATENT DOCUMENTS

| CN | 101255550 A | 9/2008 |
| CN | 102618827 A | 8/2012 |

(Continued)

OTHER PUBLICATIONS

AU Examination Report for AU Application No. 2017314804, dated Apr. 27, 2018 (6 pages).

(Continued)

*Primary Examiner* — Selim U Ahmed
(74) *Attorney, Agent, or Firm* — Fish & Richardson P.C.

(57) ABSTRACT

The present disclosure relates to perovskite thin film low-pressure chemical deposition equipment and a usage method thereof, and application of the usage method. The equipment comprises a main chamber, wherein two precursor heating plates and a substrate holddown groove are respectively arranged in the main chamber, the precursor heating plates are respectively provided with precursor containers, a plurality of groups of substrates on which a thin film is to be deposited are arranged on the substrate holddown groove, each group is provided with two substrates which are tightly attached back to back, and the surface of each of the two substrates on which a thin film is to be deposited faces towards one end of the main chamber; the left and right ends of the main chamber respectively communicate with carrier (Continued)

gas pipelines provided with carrier gas inlet mass flow control valves, the main chamber also communicates with a vacuum providing unit, and the main chamber is also provided with a main chamber heater for heating the substrates; and the carrier gas pipelines on the two ends respectively communicate with solvent evaporators. By adopting simultaneous introduction of the gas from the two ends of the main chamber and the substrate back-to-back configuration mode, the rate of preparing the perovskite thin film by the method is doubled as compared with the existing methods.

14 Claims, 3 Drawing Sheets

(51) Int. Cl.
<table>
<tr><td>C23C 16/52</td><td>(2006.01)</td></tr>
<tr><td>C23C 16/30</td><td>(2006.01)</td></tr>
<tr><td>C23C 16/56</td><td>(2006.01)</td></tr>
<tr><td>H01L 51/00</td><td>(2006.01)</td></tr>
<tr><td>C30B 25/14</td><td>(2006.01)</td></tr>
<tr><td>C30B 29/12</td><td>(2006.01)</td></tr>
<tr><td>C23C 16/448</td><td>(2006.01)</td></tr>
<tr><td>H01L 51/42</td><td>(2006.01)</td></tr>
</table>

(52) U.S. Cl.
CPC ...... *C23C 16/455* (2013.01); *C23C 16/45502* (2013.01); *C23C 16/45591* (2013.01); *C23C 16/52* (2013.01); *C23C 16/56* (2013.01); *C30B 25/14* (2013.01); *C30B 29/12* (2013.01); *H01L 51/0002* (2013.01); *H01G 9/204* (2013.01); *H01G 9/2031* (2013.01); *H01L 51/4246* (2013.01)

(58) Field of Classification Search
CPC ... C23C 16/45502; C23C 16/56; C23C 16/30; C23C 16/455; C23C 16/52; H01L 51/0002; H01L 51/4246; C30B 25/14; C30B 29/12
See application file for complete search history.

(56) References Cited

FOREIGN PATENT DOCUMENTS

<table>
<tr><td>CN</td><td>104485425</td><td>4/2015</td></tr>
<tr><td>CN</td><td>206109531 U</td><td>4/2017</td></tr>
<tr><td>JP</td><td>H4-118923 A</td><td>10/1992</td></tr>
<tr><td>JP</td><td>H9-36044 A</td><td>2/1997</td></tr>
<tr><td>JP</td><td>2004266297 A</td><td>9/2004</td></tr>
<tr><td>JP</td><td>2012505549</td><td>3/2012</td></tr>
<tr><td>WO</td><td>WO 2015/170445</td><td>11/2015</td></tr>
<tr><td>WO</td><td>WO 2016/027450 A1</td><td>2/2016</td></tr>
</table>

OTHER PUBLICATIONS

ISA/CN, International Search Report for PCT/CN2017/082794 (dated Jul. 26, 2017).
EP Extended European Search Report for EP App No. 17842618.5, dated Sep. 6, 2018 (7 pages).
JP Office Action for JP App No. 2018-514438, dated Sep. 6, 2018 (3 pages).
Leyden et al., Large formamidinium lead trihalide perovskite solar cells using chemical vapor deposition with high reproducibility and tunable chlorine concentrations, J Materials Chem, 3(31):16097-16103 (Jan. 2015).

* cited by examiner

PEROVSKITE THIN FILM LOW-PRESSURE CHEMICAL DEPOSITION EQUIPMENT AND USES THEREOF

TECHNICAL FIELD

The present disclosure belongs to the technical field of semiconductors, and particularly relates to perovskite thin film low-pressure chemical deposition equipment and a usage method thereof, and application of the usage method.

BACKGROUND ART

A solar cell is an energy converter that converts solar energy into electric energy by the photovoltaic effect of semiconductors. So far, the solar energy has become the most important renewable energy source except hydroelectric power. Materials currently used for commercially-available solar cell modules include monocrystalline silicon, polycrystalline silicon, amorphous silicon, cadmium telluride, copper indium gallium selenide and so on, but most of them are high in energy consumption and high in cost.

In recent years, a perovskite solar cell has gained widespread attention. This perovskite solar cell uses an organometallic halide as a light absorbing layer. The preparation of a thin film solar cell from the material has the advantages of simple process, low production cost, high stability and high conversion rate. Since 2009, the photoelectric conversion efficiency of the thin film solar cell has been raised from 3.8% to 22% or above, which is higher than that of the commercially-available crystalline silicon solar cell; and the thin film solar cell has great cost advantages over the commercialized crystalline silicon solar cell.

The core of the existing perovskite solar cell preparation, i.e., the preparation of a perovskite layer, can be accomplished in two ways: a solution-based way and a vapor-based way. Among them, the solution-based way has low requirements for the production environment and equipment and is easy to operate, and the film can be prepared under normal temperature and pressure. However, the uniformity of the formed perovskite thin film is poor, there are too many pinholes in the microstructure of the film, the leakage current is high, the efficiency of the solar cell is seriously affected, and the reproducibility is poor. Therefore, this way is not suitable for large-scale and large-size production. The vapor-based way may overcome these difficulties through more precise control on environment and production process parameters and may realize large-scale production through simple equipment expansion. One method for the vapor-based way involves the preparation of the perovskite layer using methods and equipment similar to those of chemical vapor deposition (CVD). In the prior art, the reactant vapor in the used CVD equipment flows unidirectionally along with carrier gas to the surface at one side of a substrate before being deposited, diffused and reacted, and a baffle is used for obscuration in order to ensure transparency at the other side of the substrate, which reduces the preparation efficiency of the perovskite layer since the baffle side of the substrate is completely unused. More importantly, in the actual production and application of a photovoltaic module, the final cost and production of the module are closely related, i.e., the higher the production is, the lower the cost of the module is.

SUMMARY OF THE INVENTION

The present disclosure aims to provide perovskite thin film low-pressure chemical deposition equipment and a usage method thereof, and application of the method. The side with a baffle on the existing substrate is changed into another substrate; when the two substrates are erected in a position according to a back-to-back mode, the flow forms of carrier gas and reactant vapor are improved at the same time, so that the carrier gas and reactant vapor simultaneously flow from the two ends of a CVD tube to a middle region which is a substrate storage and reaction region; and thus, the two back-to-back substrates can simultaneously and uniformly receive the reactant vapor to react, so that the two substrates can be simultaneously prepared in one position, thereby doubling the perovskite layer preparation efficiency, and greatly increasing the yield of large-scale production.

The present disclosure is realized by providing perovskite thin film low-pressure chemical deposition equipment and a usage method thereof, and application of the usage method. The equipment comprises a main chamber, where two precursor heating plates and a substrate holddown groove are respectively arranged in the main chamber, the two precursor heating plates are respectively adjacent to left and right ends of the main chamber, the substrate holddown groove is arranged between the two precursor heating plates, the precursor heating plates are respectively provided with precursor containers, a plurality of groups of substrates on which a thin film is to be deposited are arranged on the substrate holddown groove, each group is provided with two substrates which are tightly attached back to back, and the surface of each substrate on which a thin film is to be deposited faces towards one end of the main chamber; the left and right ends of the main chamber respectively communicate with carrier gas pipelines provided with carrier gas inlet mass flow control valves, the main chamber also communicates with a vacuum providing unit, and the main chamber is also provided with a main chamber heater for heating the substrates; and the carrier gas pipelines on the two ends respectively communicate with solvent evaporators.

Further, the main chamber heater is used for heating the groups of substrates arranged on the substrate holddown groove, and the precursor heating plates are used for heating the precursor containers arranged on the precursor heating plates. The two substrates on which a thin film is to be deposited is put as a tightly attached group onto the substrate holddown groove (the surface on which a thin film is to be deposited respectively faces towards one end of the main chamber), the reactant gas is introduced from the two ends of the main chamber through the carrier gas pipelines, the reactant gas reacts with the solvent vapor generated by the solvent evaporators and is together deposited on the surface of the substrate on which a thin film is to be deposited, and a chemical reaction occurs in the main chamber under the environmental conditions of vacuum and heating. By adopting the design structure, the deposition is simultaneously performed on the two surfaces of each group of substrates, thereby enhancing the preparation efficiency of the perovskite layer.

Further, the inside of the main chamber is also provided with diversion partitions, the diversion partitions are respectively arranged between the precursor containers and openings of the carrier gas pipelines on the two ends of the main chamber, and the diversion partitions are detachably arranged on the inner wall of the main chamber through diversion partition holddown grooves; and the diversion partitions are provided with a plurality of through holes.

The carrier gas introduced into the main chamber through the carrier gas pipelines can orderly and uniformly enter the diversion partition holddown groove region at the back after being diverted by the diversion partitions, and organic small molecules of the solvent vapor carried by the carrier gas are uniformly deposited on the surface of the substrate, thereby enhancing the chemical reaction effect of the deposited materials on the substrate surface, and obtaining the perovskite layer with crystals having larger particle size. The shape of the through holes can be diversified, i.e., at least any one of circle, triangles and other polygons.

Further, a vacuum providing unit includes a vacuum pump and a vacuum control valve, the vacuum providing unit communicates with the main chamber through a vacuum duct, the vacuum pump and the vacuum control valve are sequentially arranged on the vacuum duct, and the vacuum control valve is more adjacent to the main chamber.

The vacuum providing unit provides a proper vacuum environment for the main chamber, thereby facilitating the chemical reaction of the deposited materials.

Further, the solvent evaporators communicate with the carrier gas pipelines through solvent ducts, the solvent evaporators include solvent containers, solvent heaters and solvent vapor control valves, the solvent heaters respectively heat the solvent containers, and solvent vapor respectively enters the carrier gas pipelines through the solvent vapor control valves and the solvent ducts.

The solvent evaporators are arranged on the outer side of the main chamber, thereby controlling the solvent evaporation temperature and vapor flow rate more accurately, and enhancing the deposition effect of the substrate thin film.

Further, the carrier gas pipelines also respectively communicate with reserved functional gas devices, and the reserved functional gas devices include reserved functional gas ducts and reserved functional gas inlet valves. The types of the functional gas includes but not limited to hydrogen, oxygen, methane and the like, and the functional gas is used for regulating the element ratio and electrical properties of the final reaction product in the reaction.

The present disclosure also discloses a usage method of the perovskite thin film low-pressure chemical deposition equipment as mentioned above, including the following steps:

(i) Cleaning of Substrates

Respectively performing ultrasonic cleaning on the substrates sequentially by using a surfactant, deionized water, acetone and isopropanol for 20 minutes, blow-drying with nitrogen, and performing ultraviolet-ozone sterilization treatment for 5 minutes;

(ii) Preparation of $BX_2$ Layer

On the substrates treated in the step (i), depositing a $BX_2$ layer having a thickness of 100 nm-1000 nm on the surface at one side by a solution method or vacuum evaporation, where B is at least one cation of lead, tin, tungsten, copper, zinc, gallium, germanium, arsenic, selenium, rhodium, palladium, silver, cadmium, indium, antimony, osmium, iridium, platinum, gold, mercury, thallium, bismuth and polonium; X is at least one anion of iodine, bromine, chlorine and astatine;

(iii) Preparation of Perovskite Layer

Putting the substrates on which the $BX_2$ is deposited in the step (ii) on the substrate holddown groove of the main chamber, where the surfaces of the two substrates without any thin film deposited thereon are tightly attached back to back, and the surfaces with the thin film deposited thereon respectively face towards one end of the main chamber;

Adding a reactant AX into the precursor containers, where A is at least one of amine, amidino or alkali family;

Starting the vacuum providing unit so that the vacuum degree in the main chamber is 1 Pa-$10^5$ Pa;

Starting the main chamber heater to preheat the main chamber so that the temperature of the main chamber is 50-250° C.;

After the temperature in the main chamber becomes stable, switching on the precursor heating plates, controlling the temperature of the precursor heating plates so that the temperature of precursor heating plate temperature regions is 10-100° C. higher than that of a substrate temperature region of the substrate holddown groove, and holding the reaction process for 5-120 minutes;

After the temperature of the precursor heating plates becomes stable, opening the carrier gas inlet mass flow control valves, and regulating the gas input of the main chamber so that the thin film on the surface of the substrate starts the chemical reaction, where the type of carrier gas is at least one of nitrogen, helium and argon;

3-100 minutes after the chemical reaction is started, introducing solvent vapor into the main chamber by using the solvent evaporators, where the solvent includes but not limited to methanol, ethanol, isopropanol, ethylene glycol, dimethyl sulfoxide, N,N-dimethylformamide, γ-butyrolactone and N-methyl-2-pyrrolidone, and the evaporation temperature of the solvent is controlled at 50-150° C.; and the duration time is 5-100 minutes.

(iv) Annealing Treatment

After the chemical reaction is finished, removing the residual reactant AX in the precursor containers, heating the substrates in the main chamber to 50-250° C. within 5-60 minutes under the pressure of $10^{-5}$ Pa-$10^5$ Pa; and after the heating is finished, slowly introducing at least one of nitrogen, helium and argon into the main chamber through the carrier gas pipelines, and waiting until the main chamber is naturally cooled.

Further, the detachable diversion partitions can be in a mounted state or demounted state; and if mounting is required, the diversion partitions are respectively fixed to the diversion partition holddown grooves.

The present disclosure also discloses application of the usage method of the perovskite thin film low-pressure chemical deposition equipment as mentioned above. The usage method is applied for manufacturing a perovskite solar cell.

Further, the process of manufacturing the perovskite solar cell includes the following steps:

(a) selecting a proper transparent substrate layer including but not limited to a glass substrate and a polyethylene terephthalate (PET) substrate, and depositing a transparent conductive layer including but not limited to indium-doped tin oxide (ITO), fluorine-doped tin oxide (FTO) and grapheme on the substrate layer;

(b) depositing a hole transport layer or an electron transport layer on the transparent conductive layer, where the material includes but not limited to graphene, PEDOT:PSS, PTAA, CuSCN, CuI, MoOx, $WO_3$, $V_2O_5$, NiO, PEI, $ZrO_2$, ZnO, $TiO_2$, $SnO_2$, BCP, and C60 and derivatives thereof; and the deposition method includes but not limited to vacuum evaporation, electron-beam evaporation, magnetron sputtering, atomic layer deposition, photoetching, chemical vapor deposition, screen printing, a hydrothermal process, electrochemical deposition, spin-coating, blade-coating, bar coating, slot-die coating, spray coating and ink-jet printing;

(c) depositing a perovskite layer on the hole transport layer or the electron transport layer, including: on the substrate treated in the step (b), depositing a $BX_2$ layer having a thickness of 100 nm-1000 nm on the surface at one side by a solution method or vacuum evaporation, where B is at least one cation of lead, tin, tungsten, copper, zinc, gallium, germanium, arsenic, selenium, rhodium, palladium, silver, cadmium, indium, antimony, osmium, iridium, platinum, gold, mercury, thallium, bismuth and polonium, and X is at least one anion of iodine, bromine, chlorine and astatine; putting the substrates on which the $BX_2$ is deposited on the substrate holddown groove of the main chamber, where the surfaces without any thin film deposited on the two substrates are tightly attached to each other, and the surfaces with the thin film deposited respectively face towards one end of the main chamber; adding a reactant AX into the precursor containers, where A is at least one of amine, amidino or alkali family; starting the vacuum providing unit so that the pressure in the main chamber is $10^{-5}$ Pa-$10^5$ Pa; preheating the main chamber so that the temperature of the main chamber is 50-250° C.; after the temperature in the main chamber becomes stable, switching on the precursor heating plates, controlling the temperature of the precursor heating plates so that the temperature of the precursor heating plate temperature regions is 10-100° C. higher than that of the substrate temperature region of the substrate holddown groove, and holding the reaction process for 5-120 minutes; after the temperature of the precursor heating plates becomes stable, opening the carrier gas inlet mass flow control valves, and regulating the gas input of the main chamber so that the thin film on the surface of the substrate starts the chemical reaction, where the type of carrier gas is at least one of nitrogen, helium and argon; 3-100 minutes after the chemical reaction is started, introducing solvent vapor into the main chamber by using the solvent evaporators, where the solvent includes but not limited to methanol, ethanol, isopropanol, ethylene glycol, dimethyl sulfoxide, N,N-dimethylformamide, γ-butyrolactone and N-methyl-2-pyrrolidone, the evaporation temperature of the solvent is controlled at 50-150° C., and the reaction time is 5-100 minutes; after the chemical reaction is finished, removing the residual reactant AX in the precursor containers, heating the substrates in the main chamber to 50-250° C. within 5-60 minutes under the pressure of $10^{-5}$ Pa-$10^5$ Pa; and after the heating is finished, slowly introducing at least one of nitrogen, helium and argon into the main chamber through the carrier gas pipelines, and waiting until the main chamber is naturally cooled, thereby forming a semiconductor light absorbing layer;

(d) depositing a hole transport layer or an electron transport layer on the semiconductor light absorbing layer, where the material includes but not limited to graphene, PEDOT:PSS, PTAA, CuSCN, CuI, MoOx, $WO_3$, $V_2O_5$, NiO, PEI, $ZrO_2$, ZnO, $TiO_2$, $SnO_2$, BCP, and C60 and derivatives thereof; and the deposition method includes but not limited to vacuum evaporation, electron-beam evaporation, magnetron sputtering, atomic layer deposition, photoetching, chemical vapor deposition, screen printing, a hydrothermal process, electrochemical deposition, spin-coating, blade-coating, bar coating, slot-die coating, spray coating and ink-jet printing;

(e) depositing a metal conducting layer on the structure formed in the step (d).

Compared with the prior art, according to the perovskite thin film low-pressure chemical deposition equipment and usage method thereof, and application of the usage method in the present disclosure, by adopting simultaneous introduction of the gas from the two ends of the main chamber and the substrate back-to-back configuration mode, the rate of preparing the perovskite thin film by the method is doubled as compared with the existing methods. Besides, by introducing the solvent vapor and regulating the pressure to a proper value, the particle size of the crystals of the perovskite thin film is also increased to 1 micrometer or above, which is much higher than 200 nm-300 nm in the original method.

DETAILED DESCRIPTION OF THE INVENTION

To more clearly understand the technical solution and beneficial effect of the present disclosure, the present disclosure will be explained in details below in combination with the drawings and examples. It should be understood that the specific examples described herein are only to explain the present disclosure and not to limit the present disclosure.

Figure 1:
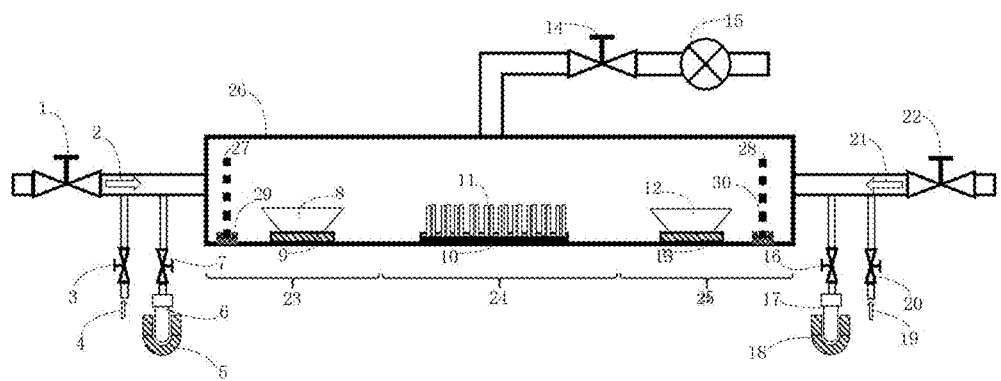
FIG. 1 is a schematic plan view illustrating a preferred example of perovskite thin film low-pressure chemical deposition equipment according to an example of the present disclosure.

As shown in FIG. 1, the perovskite thin film low-pressure chemical deposition equipment includes a main chamber 26, carrier gas pipelines, a vacuum providing unit, a main chamber heater and solvent evaporators.

The carrier gas pipelines are arranged on the left and right ends of the main chamber 26, and respectively communicate with the main chamber 26 through carrier gas inlet mass flow control valves 1 and 22. The arrows 2 and 21 indicate the flow directions of the carrier gas. The vacuum providing unit communicates with the main chamber 26. The main chamber heater is arranged on the main chamber 26 and used for heating the main chamber 26. The solvent evaporators are arranged on the carrier gas pipelines at the two ends and respectively communicate with the carrier gas pipelines.

Two precursor heating plates 9 and 13 and a substrate holddown groove 10 are respectively arranged in the main chamber 26, the two precursor heating plates 9 and 13 are respectively adjacent to the left and right ends of the main chamber 26, and the substrate holddown groove 10 is arranged between the two precursor heating plates 9 and 13. The precursor heating plates 9 and 13 are respectively provided with precursor containers 8 and 12, and a plurality of groups of substrates 11 on which a thin film is to be deposited are arranged on the substrate holddown groove 10. Each group is provided with two substrates 11 which are tightly attached back to back, and the surface of each substrate 11 on which a thin film is to be deposited faces towards one end of the main chamber 26. The main chamber heater is used for heating the substrates 11.

Figure 2:
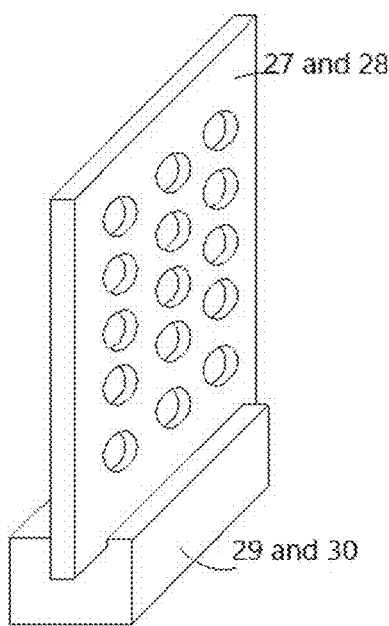
FIG. 2 is an enlarged schematic view of part A in FIG. 1.

Further, the inside of the main chamber 26 is also provided with diversion partitions 27 and 28, the diversion partitions 27 and 28 are respectively arranged between the precursor containers 8 and 12 and openings of the carrier gas pipelines on the two ends of the main chamber 26, and the diversion partitions 27 and 28 are detachably arranged on the inner wall of the main chamber 26 through diversion partition holddown grooves 29 and 30. As shown in FIG. 2, the diversion partitions 27 and 28 are respectively detachably arranged on the diversion partition holddown grooves 29 and 30, and the diversion partitions 27 and 28 are dismounted or mounted as required. The diversion partitions 27 and 28 are provided with a plurality of through holes.

The vacuum providing unit includes a vacuum pump 15 and a vacuum control valve 14, the vacuum providing unit communicates with the main chamber 26 through a vacuum duct, the vacuum pump 15 and the vacuum control valve 14 are sequentially arranged on the vacuum duct, and the vacuum control valve 14 is more adjacent to the main chamber 26. The vacuum providing unit is arranged to control the gas pressure in the main chamber 26 and provide proper reaction pressure for thin film deposition.

The solvent evaporators communicate with the carrier gas pipelines through solvent ducts. The solvent evaporators include solvent containers 6 and 17, solvent heaters 5 and 18 and solvent vapor control valves 7 and 16, the solvent heaters 5 and 18 respectively heat the solvent containers 6 and 17, and solvent vapor respectively enters the carrier gas pipelines through the solvent vapor control valves 7 and 16 and the solvent ducts.

The carrier gas pipelines also respectively communicate with reserved functional gas devices, and the reserved functional gas devices include reserved functional gas ducts and reserved functional gas inlet valves 3 and 20. The arrows 4 and 19 indicate the flow directions of reserved functional gas.

The present disclosure also discloses a usage method of the perovskite thin film low-pressure chemical deposition equipment as mentioned above, including the following steps:

(i) Cleaning of Substrates

Respectively performing ultrasonic cleaning on the substrates 11 sequentially by using a surfactant, deionized water, acetone and isopropanol for 20 minutes, blow-drying with nitrogen, and performing ultraviolet-ozone sterilization treatment for 5 minutes;

(ii) Preparation of $BX_2$ Layer

On the substrate 11 treated in the step (i), depositing a $PbX_2$ layer having a thickness of 100 nm-1000 nm on the surface at one side by a solution method or vacuum evaporation, where B is at least one cation of lead, tin, tungsten, copper, zinc, gallium, germanium, arsenic, selenium, rhodium, palladium, silver, cadmium, indium, antimony, osmium, iridium, platinum, gold, mercury, thallium, bismuth and polonium; and X is at least one anion of iodine, bromine, chlorine and astatine.

(iii) Preparation of Perovskite Layer

Putting the substrates 11 on which the $BX_2$ is deposited in the step (ii) on the substrate holddown groove 10 of the main chamber 26, where the surfaces without any thin film deposited on the two substrates 11 are tightly attached to each other back to back, and the surfaces with the thin film deposited respectively face towards one end of the main chamber 26; adding a reactant AX into the precursor containers 8 and 12, where A is at least one of amine, amidino or alkali family; starting the vacuum providing unit so that the pressure in the main chamber 26 is $10^{-5}$ Pa-$10^5$ Pa; starting the main chamber heater to preheat the main chamber 26 so that the temperature of the main chamber 26 is 50-250° C.; after the temperature in the main chamber 26 becomes stable, switching on the precursor heating plates 9 and 13, controlling the temperature of the precursor heating plates 9 and 13 so that the temperature of precursor heating plate temperature regions 23 and 25 is 10-100° C. higher than that of substrate temperature region 24 of the substrate holddown groove 10, and holding the reaction process for 5-120 minutes; after the temperature of the precursor heating plates 9 and 13 becomes stable, opening the carrier gas inlet mass flow control valves 1 and 22, and regulating the gas input of the main chamber 26 so that the thin film on the surface of the substrate 11 starts the chemical reaction, where the type of carrier gas is at least one of nitrogen, helium and argon; 3-100 minutes after the chemical reaction is started, introducing solvent vapor into the main chamber 26 by using the solvent evaporators, where the solvent includes but not limited to methanol, ethanol, isopropanol, ethylene glycol, dimethyl sulfoxide, N,N-dimethylformamide, γ-butyrolactone and N-methyl-2-pyrrolidone, the evaporation temperature of the solvent is controlled at 50-150° C., and the duration time is 5-100 minutes.

(iv) Annealing Treatment

After the chemical reaction is finished, removing residual reactant AX in the precursor containers 8 and 12, heating the substrates 11 in the main chamber 26 to 50-250° C. within 5-60 minutes under the vacuum degree of 1 Pa-$10^5$ Pa; and after the heating is finished, slowly introducing at least one of nitrogen, helium and argon into the main chamber 26 through the carrier gas pipelines, and waiting until the main chamber 26 is naturally cooled.

The detachable diversion partitions 27 and 28 can be in a mounted state or demounted state; and if mounting is required, the diversion partitions 27 and 28 are respectively fixed to the diversion partition holddown grooves 29 and 30.

The present disclosure also discloses application of the usage method of the perovskite thin film low-pressure chemical deposition equipment as mentioned above. The usage method is applied to manufacturing a perovskite solar cell. The following is a further illustration of the examples.

I. EXAMPLE 1

The process for manufacturing a perovskite solar cell includes the following steps:

(a) selecting a glass substrate as a transparent substrate layer, and depositing a transparent conductive layer on the substrate layer, where the transparent conductive layer is indium-doped tin oxide.

(b) depositing a hole transport layer on the transparent conductive layer, where the material is PEDOT:PSS, and the deposition method is blade-coating.

(c) depositing a perovskite layer on the hole transport layer, including: on the substrate treated in the step (b), depositing a $PbCl_2$ layer having a thickness of 100 nm-200 nm by a solution method; putting the substrates on which the $PbCl_2$ is deposited on the substrate holddown groove 10 of the main chamber 26, where the surfaces without any deposited thin film on the two substrates are tightly attached to each other, and the surfaces with the deposited thin film respectively face towards one end of the main chamber 26; adding a reactant $CH_3NH_3I$ into the precursor containers 8 and 12; starting the vacuum providing unit so that the pressure in the main chamber 26 is 1 Pa-100 Pa; preheating the main chamber 26 so that the temperature of the main chamber 26 is 50-100° C.; after the temperature in the main chamber 26 becomes stable, switching on the precursor heating plates 9 and 13, controlling the temperature of the precursor heating plates 9 and 13 so that the temperature of the precursor heating plate temperature regions 23 and 25 is 10-100° C. higher than that of the substrate temperature region 24 of the substrate holddown groove 10, and holding the reaction process for 5-120 minutes; after the temperature of the precursor heating plates 9 and 13 becomes stable, opening the carrier gas inlet mass flow control valves 1 and 22, and regulating the gas input of the main chamber 26 so that the thin film on the surface of the substrate 11 starts the chemical reaction, where the type of carrier gas is nitrogen; 3-100 minutes after the chemical reaction is started, introducing solvent vapor into the main chamber 26 by using the solvent evaporators, where the solvent is methanol, the evaporation temperature of the solvent is controlled at 50-100° C., and the evaporation time is 1-10 minutes; after the chemical reaction is finished, removing residual reactant $CH_3NH_3I$ in the precursor containers 8 and 12, heating the substrates 11 in the main chamber 26 to 50-100° C. within 5-60 minutes under the pressure of 1 Pa-100 Pa; and after the heating is finished, slowly introducing the nitrogen into the main chamber 26 through the carrier gas pipelines, and waiting until the main chamber 26 is naturally cooled, thereby forming a semiconductor light absorbing layer;

(d) depositing an electron transport layer on the semiconductor light absorbing layer, where the material is titanium dioxide, and the deposition method is magnetron sputtering.

(e) depositing a metal conducting layer on the structure formed in the step (d).

II. EXAMPLE 2

The process for manufacturing another perovskite solar cell includes the following steps:
(a) selecting a glass substrate as a transparent substrate layer, and depositing a transparent conductive layer on the substrate layer, where the transparent conductive layer is fluorine-doped tin oxide.

(b) depositing a hole transport layer on the transparent conductive layer, where the material is NiO, and the deposition method is vacuum evaporation;

(c) depositing a perovskite layer on the hole transport layer, including: on the substrate treated in the step (b), depositing a $PbBr_2$ layer having a thickness of 400 nm-600 nm by vacuum evaporation; putting the substrates on which the $PbBr_2$ is deposited on the substrate holddown groove 10 of the main chamber 26, where the surfaces without any deposited thin film on the two substrates are tightly attached to each other, and the surfaces with the thin film deposited respectively face towards one end of the main chamber 26; adding a reactant $CH_3NH_3Br$ into the precursor containers 8 and 12; starting the vacuum providing unit so that the vacuum degree in the main chamber 26 is 100 Pa-1000 Pa; preheating the main chamber 26 so that the temperature of the main chamber 26 is 100-200° C.; after the temperature in the main chamber 26 becomes stable, switching on the precursor heating plates 9 and 13, controlling the temperature of the precursor heating plates 9 and 13 so that the temperature of the precursor heating plate temperature regions 23 and 25 is 10-100° C. higher than that of the substrate temperature region 24 of the substrate holddown groove 10, and holding the reaction process for 5-120 minutes; after the temperature of the precursor heating plates 9 and 13 becomes stable, opening the carrier gas inlet mass flow control valves 1 and 22, and regulating the gas input of the main chamber 26 so that the thin film on the surface of the substrate 11 starts the chemical reaction, where the type of carrier gas is helium; 3-100 minutes after the chemical reaction is started, introducing solvent vapor into the main chamber 26 by using the solvent evaporators, where the solvent is dimethyl sulfoxide, the evaporation temperature of the solvent is controlled at 100-150° C., and the heating time is 30-50 minutes; after the chemical reaction is finished, removing residual reactant $CH_3NH_3Br$ in the precursor containers 8 and 12, heating the substrates 11 in the main chamber 26 to 100-200° C. within 5-60 minutes under the vacuum degree of $10^{-3}$ Pa-1 Pa; and after the heating is finished, slowly introducing the helium into the main chamber 26 through the carrier gas pipelines, and waiting until the main chamber 26 is naturally cooled, thereby forming a semiconductor light absorbing layer;

(d) depositing an electron transport layer on the semiconductor light absorbing layer, where the material is $SnO_2$, and the deposition method is slot-die coating.

(e) depositing a metal conducting layer on the structure formed in the step (d).

III. EXAMPLE 3

The process for manufacturing still another perovskite solar cell includes the following steps:
(a) selecting a polyethylene terephthalate substrate as a transparent substrate layer, and depositing a transparent conductive layer on the substrate layer, where the transparent conductive layer is graphene.

(b) depositing an electron transport layer on the transparent conductive layer, where the material is PCBM, and the deposition method is blade-coating.

(c) depositing a perovskite layer on the electron transport layer, including: on the substrate treated in the step (b), depositing a $PbI_2$ layer having a thickness of 800 nm-1000 nm by a solution method or vacuum evaporation; putting the substrate on which the $PbI_2$ is deposited on the substrate holddown groove 10 of the main chamber 26, where the surfaces without any deposited thin film on the two substrates are tightly attached to each other, and the surfaces with the deposited thin film respectively face towards one end of the main chamber 26; adding a reactant $HC(NH_2)_2I$ into the precursor containers 8 and 12; starting the vacuum providing unit so that the vacuum degree in the main chamber 26 is $10^4$ Pa-$10^5$ Pa; preheating the main chamber 26 so that the temperature of the main chamber 26 is 200-250° C.; after the temperature in the main chamber 26 becomes stable, switching on the precursor heating plates 9 and 13, controlling the temperature of the precursor heating plates 9 and 13 so that the temperature of the precursor heating plate temperature regions 23 and 25 is 10-100° C. higher than that of the substrate temperature region 24 of the substrate holddown groove 10, and holding the reaction process for 5-120 minutes; after the temperature of the precursor heating plates 9 and 13 becomes stable, opening the carrier gas inlet mass flow control valves 1 and 22, and regulating the gas input of the main chamber 26 so that the thin film on the surface of the substrate 11 starts the chemical reaction, where the type of carrier gas is argon; 3-100 minutes after the chemical reaction is started, introducing solvent vapor into the main chamber 26 by using the solvent evaporators, where the solvent is N-methyl-2-pyrrolidone, the evaporation temperature of the solvent is controlled at 50-150° C., and the reaction time is 60-80 minutes; after the chemical reaction is finished, removing residual reactant $HC(NH_2)_2I$ in the precursor containers 8 and 12, heating the substrates 11 in the main chamber 26 to 200-250° C. within 5-60 minutes under the vacuum degree of $10^4$ Pa-$10^5$ Pa; and after the heating is finished, slowly introducing the argon into the main chamber 26 through the carrier gas pipelines, and waiting until the main chamber 26 is naturally cooled, thereby forming a semiconductor light absorbing layer;

(d) depositing a hole transport layer on the semiconductor light absorbing layer, where the material is $WO_3$, and the deposition method is vacuum evaporation.

(e) depositing a metal conducting layer on the structure formed in the step (d).

IV. EXAMPLE 4

The process for manufacturing yet another perovskite solar cell, including the following steps:

(a) selecting polyethylene terephthalate as a transparent substrate layer, and depositing a transparent conductive layer on the substrate layer, where the transparent conductive layer is indium-doped tin oxide.

(b) depositing a hole transport layer on the transparent conductive layer, where the material is CuSCN, and the deposition method is spraying coating.

(c) depositing a perovskite layer on the electron transport layer, including: on the substrate treated in the step (b), depositing a $PbCl_2$ layer having a thickness of 200 nm-800 nm by a solution method; putting the substrate on which the $PbCl_2$ is deposited on the substrate holddown groove 10 of the main chamber 26, where the surfaces without any deposited thin film on the two substrates are tightly attached to each other, and the surfaces with the deposited thin film respectively face towards one end of the main chamber 26; adding a reactant $CH_3NH_3I$ into the precursor containers 8 and 12; starting the vacuum providing unit so that the vacuum degree in the main chamber 26 is 1 Pa-$10^5$ Pa; preheating the main chamber 26 so that the temperature of the main chamber 26 is 50-250° C.; after the temperature in the main chamber 26 becomes stable, switching on the precursor heating plates 9 and 13, controlling the temperature of the precursor heating plates 9 and 13 so that the temperature of the precursor heating plate temperature regions 23 and 25 is 10-100° C. higher than that of the substrate temperature region 24 of the substrate holddown groove 10, and holding the reaction process for 5-120 minutes; after the temperature of the precursor heating plates 9 and 13 becomes stable, opening the carrier gas inlet mass flow control valves 1 and 22, and regulating the gas input of the main chamber 26 so that the thin film on the surface of the substrate 11 starts the chemical reaction, where the type of carrier gas is nitrogen; 3-100 minutes after the chemical reaction is started, introducing solvent vapor into the main chamber 26 by using the solvent evaporators, where the solvent is ethylene glycol, and the evaporation temperature of the solvent is controlled at 50-100° C.; after the chemical reaction is finished, removing residual reactant $CH_3NH_3I$ in the precursor containers 8 and 12, heating the substrates 11 in the main chamber 26 to 50-250° C. within 5-60 minutes under the vacuum degree of 1 Pa-$10^5$ Pa; and after the heating is finished, slowly introducing the nitrogen into the main chamber 26 through the carrier gas pipelines, and waiting until the main chamber 26 is naturally cooled, thereby forming a semiconductor light absorbing layer;

(d) depositing an electron transport layer on the semiconductor light absorbing layer, where the material is C60, and the deposition method is vacuum evaporation.

(e) depositing a metal conducting layer on the structure formed in the step (d).

In conclusion, the process for preparing the perovskite thin film by using the equipment and the method includes:
(1) cleaning the substrate;
(2) depositing a $BX_2$ thin film having a thickness of 100-1000 nm;
(3) putting the substrate into the main chamber of the equipment, and preheating the main chamber;
(4) pumping down the main chamber;
(5) heating the precursor temperature regions;
(6) opening the carrier gas valves, and starting the reaction;
(7) after the reaction is finished, removing the residual precursor, continuing heating the main chamber, and performing annealing on the substrates.

Figure 3:
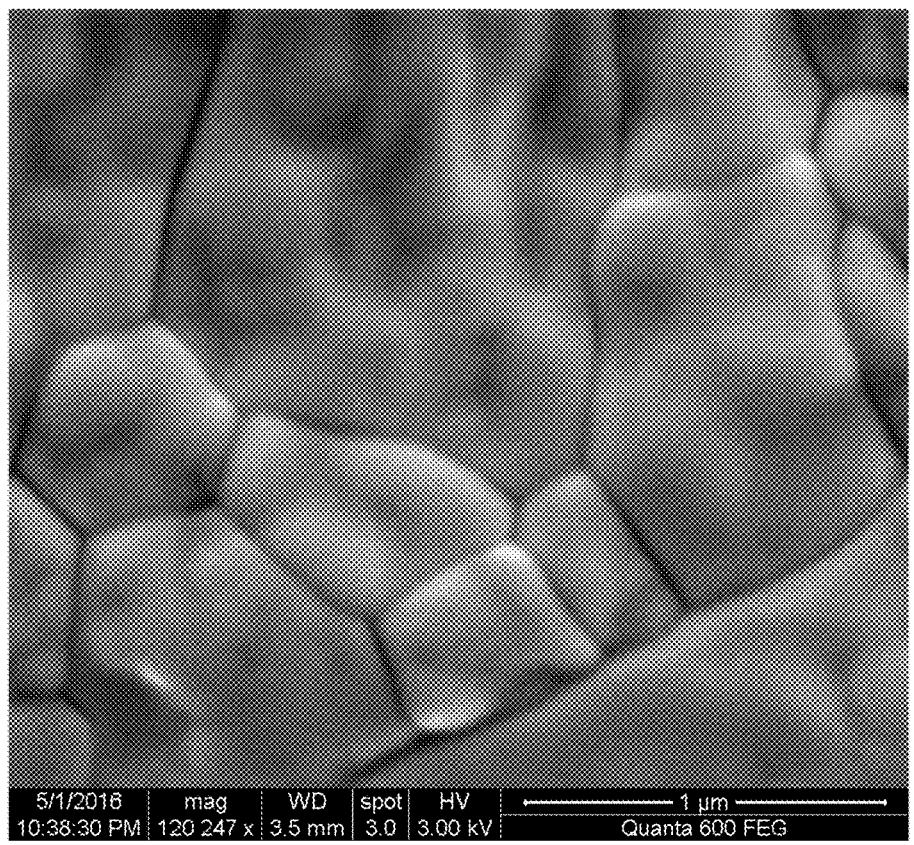
FIG. 3 is a schematic diagram illustrating a thin film of a perovskite thin film layer prepared by using a equipment and a method according to an example of the present disclosure.

FIG. 3 illustrates a schematic image of a perovskite thin film layer prepared by using the equipment and method of the present disclosure under a scanning electron microscope. It can be seen from the diagram that the surface of the perovskite thin film is smooth and the particle size of crystals is 1 micron or so.

Figure 4:
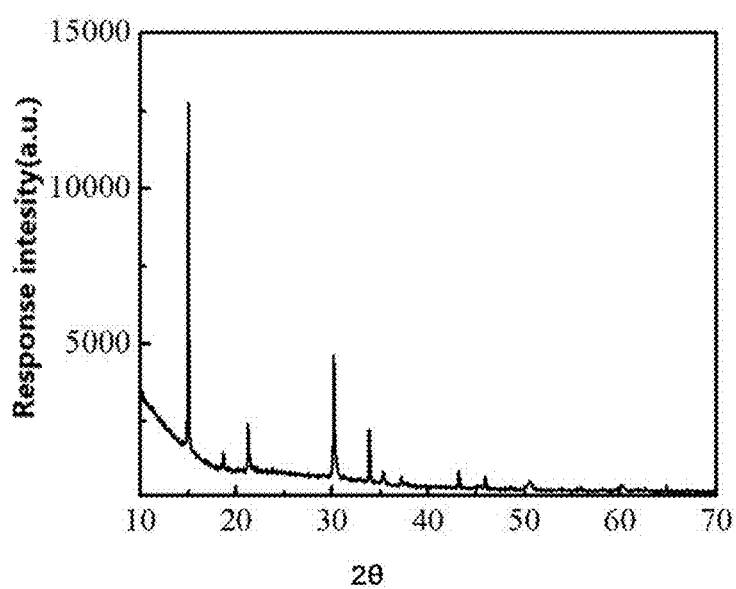
FIG. 4 is a schematic diagram illustrating X-ray diffraction of a thin film of a perovskite thin film layer of FIG. 3 according to an example of the present disclosure.
Figure 5:
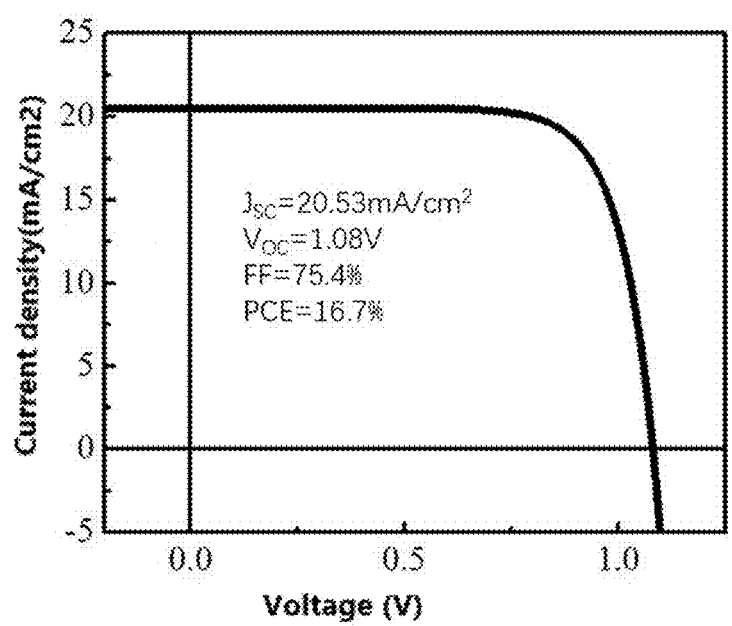
FIG. 5 is a schematic diagram illustrating a J-V test curve of a perovskite solar cell prepared by using equipment and method according to an example of the present disclosure.

FIG. 4 and FIG. 5 illustrate the schematic diagrams showing the photo-electric conversion performance of the perovskite thin film prepared by using the equipment and the method of the present disclosure. It can be seen from the diagrams that the photoelectric conversion performance of the perovskite thin film is excellent. FIG. 4 is the schematic diagram illustrating X-ray diffraction of a perovskite thin film. It can be seen from the diagram that a peak signal at a position $2\theta=14.87°$ is strongest. According to what's reported in Sheng, J. Phys. Chem. C, 2015, 119, 3545-3549 and other literatures, the peak position corresponds to a [100]-face perovskite crystal type, and there is no peak position caused by $PbX_2$ residue. FIG. 5 illustrates a J-V test curve of the perovskite solar cell taking a perovskite thin film as a light absorbing layer. It can be seen from the diagram that the photoelectric conversion performance of a perovskite solar cell prepared by this method suitable for large-batch industrial production is up to 16% or above, which is comparable to that of the commercially-available solar cell module.

The foregoing descriptions are merely preferred examples of the present disclosure, and are not intended to limit the present disclosure. Any modification, equivalent substitution, improvement or the like within the spirit and principle of the present disclosure shall fall within the protection scope of the present disclosure.

What is claimed is:

1. A perovskite thin film low-pressure chemical vapor deposition equipment, comprising a main chamber, wherein:
two precursor heating plates and a substrate holddown groove are respectively arranged in the main chamber, the two precursor heating plates are respectively adjacent to the left and right end of the main chamber, the substrate holddown groove is arranged between the two precursor heating plates, the precursor heating plates are respectively provided with precursor containers, a plurality of groups of substrates on which a thin film is to be deposited are arranged on the substrate holddown groove, each group of substrates is provided with two substrates which are arranged back to back, so that the surface of the left substrate faces left end of the main chamber and the surface of the right substrate faces right end of the main chamber, each of these surfaces is to be deposited with a layer of thin film;
the left end and right end of the main chamber respectively are connected with carrier gas pipelines equipped with carrier gas inlet mass flow control valves, the main chamber is also connected with a vacuum providing unit, and the main chamber is also equipped with a heating component for heating the substrates; and
the carrier gas pipelines on the two ends respectively are connected with solvent evaporators.

2. The equipment of claim 1, wherein the inside of the main chamber is further provided with diversion partitions, the diversion partitions are respectively arranged between the precursor containers and openings of the carrier gas pipelines on the two ends of the main chamber, and the diversion partitions are detachably arranged on the inner wall of the main chamber through diversion partition holddown grooves.

3. The equipment of claim 1, wherein the vacuum providing unit comprises a vacuum pump and a vacuum control valve, the vacuum providing unit is connected with the main chamber through a vacuum duct, the vacuum pump and the vacuum control valve are sequentially arranged on the vacuum duct, and the vacuum control valve is between the main chamber and the vacuum pump.

4. The equipment of claim 1, wherein the solvent evaporators are connected with the carrier gas pipelines through solvent ducts, the solvent evaporators comprise solvent containers, solvent heaters and solvent vapor control valves, the solvent heaters respectively heat the solvent containers, and solvent vapor respectively enters the carrier gas pipelines through the solvent vapor control valves and the solvent ducts.

5. The equipment of claim 1, wherein the carrier gas pipelines are also respectively connected with reserved functional gas devices, and the reserved functional gas devices comprise reserved functional gas ducts and reserved functional gas inlet valves.

6. The equipment of claim 2, wherein the vacuum providing unit comprises a vacuum pump and a vacuum control valve, the vacuum providing unit is connected with the main chamber through a vacuum duct, the vacuum pump and the vacuum control valve are sequentially arranged on the vacuum duct, and the vacuum control valve is between the main chamber and the vacuum pump.

7. The equipment of claim 2, wherein the solvent evaporators are connected with the carrier gas pipelines through solvent ducts, the solvent evaporators comprise solvent containers, solvent heaters and solvent vapor control valves, the solvent heaters respectively heat the solvent containers, and solvent vapor respectively enters the carrier gas pipelines through the solvent vapor control valves and the solvent ducts.

8. The equipment of claim 2, wherein the carrier gas pipelines are also respectively connected with reserved functional gas devices, and the reserved functional gas devices comprise reserved functional gas ducts and reserved functional gas inlet valves.

9. A method of forming a perovskite film, comprising the following steps:
(i) providing a perovskite thin film low-pressure chemical vapor deposition equipment, comprising a main chamber, wherein:
two precursor heating plates and a substrate holddown groove are respectively arranged in the main chamber, the two precursor heating plates are respectively adjacent to the left and right end of the main chamber, the substrate holddown groove is arranged between the two precursor heating plates, the precursor heating plates are respectively provided with precursor containers, a plurality of groups of substrates on which a thin film is to be deposited are arranged on the substrate holddown groove, each group of substrates is provided with two substrates which are arranged back to back, so that the surface of the left substrate faces left end of the main chamber and the surface of the right substrate faces right end of the main chamber, each of these surfaces is to be deposited with a layer of thin film;
the left end and right end of the main chamber respectively are connected with carrier gas pipelines equipped with carrier gas inlet mass flow control valves, the main chamber is also connected with a vacuum providing unit, and the main chamber is also equipped with a heating component for heating the substrates;
the carrier gas pipelines on the two ends respectively are connected with solvent evaporators; and
the inside of the main chamber is further provided with diversion partitions, the diversion partitions are respectively arranged between the precursor containers and openings of the carrier gas pipelines on the two ends of the main chamber, and the diversion partitions are detachably arranged on the inner wall of the main chamber through diversion partition holddown grooves;

(ii) preparation of $BX_2$ layer
depositing a $BX_2$ layer having a thickness of 100 nm-1000 nm on the surface at one side of the substrates, wherein B is at least one cation of lead, tin, tungsten, copper, zinc, gallium, germanium, arsenic, selenium, rhodium, palladium, silver, cadmium, indium, antimony, osmium, iridium, platinum, gold, mercury, thallium, bismuth and polonium; X is at least one anion of iodine, bromine, chlorine and astatine;

(iii) preparation of perovskite layer
putting the substrates on which the $BX_2$ is deposited in the step (ii) into the substrate holddown groove of the main chamber, wherein the surfaces without any deposited thin film on the two substrates are attached to each other back to back, and the surfaces with the deposited thin film respectively face towards one end of the main chamber respectively;
adding a reactant AX into the precursor containers, wherein A is at least one of amine, amidino or alkali family;
starting the vacuum providing unit so that the pressure in the main chamber is $10^{-5}$ Pa-$10^5$ Pa;
preheating the main chamber so that the temperature of the main chamber is 50-250° C.;
switching on the precursor heating plates, controlling the temperature of the precursor heating plates so that the temperature of precursor heating plates temperature regions is 10-100° C. higher than that of a substrate temperature region of the substrate holddown groove, and holding the reaction process for 5-120 minutes;
opening the carrier gas inlet mass flow control valves, and regulating the gas input of the main chamber so that the thin film on the surface of the substrate starts the chemical reaction, wherein the type of carrier gas is at least one of nitrogen, helium and argon;
3-100 minutes after the chemical reaction is started, introducing solvent vapor into the main chamber by using the solvent evaporators, wherein the solvent includes methanol, ethanol, isopropanol, ethylene glycol, dimethyl sulfoxide, N,N-dimethylformamide, γ-butyrolactone, or N-methyl-2-pyrrolidone, the evaporation temperature of the solvent is controlled at 50-150° C., and the duration time is 5-100 minutes;

(iv) annealing treatment
removing the residual reactant AX in the precursor containers, heating the substrates in the main chamber to 50-250° C. within 5-60 minutes under the vacuum degree of 1 Pa-$10^{-5}$ Pa;

and after the heating, slowly introducing at least one of nitrogen, helium and argon into the main chamber through the carrier gas pipelines, and waiting until the main chamber is cooled.

10. The method of claim 9, wherein the detachable diversion partitions can be in a mounted state or demounted state; and if mounting is required, the diversion partitions are respectively fixed to the diversion partition holddown grooves.

11. The method of claim 9, wherein the method forms a perovskite solar cell.

12. A method of manufacturing a perovskite solar cell, comprising:
(a) selecting a transparent substrate, and depositing a transparent conductive layer on the substrate;
(b) depositing a hole transport layer or an electron transport layer on the transparent conductive layer;
(c) depositing a perovskite layer on the hole transport layer or the electron transport layer using the method of claim 7, thereby forming a perovskite light absorbing layer;
(d) depositing a hole transport layer or an electron transport layer on the perovskite light absorbing layer;
(e) depositing a metal conducting layer on the structure formed in step (d).

13. The method of claim 12, wherein the hole transport layer or the electron transport layer in step (b) or (d) comprises graphene, poly(3,4-ethylenedioxythiophene) polystyrene sulfonate (PEDOT:PSS), polytriarylamine (PTAA), cuprous rhodanide (CuSCN), cuprous iodide (CuI), molybdenum oxide (MoOx), tungsten oxide ($WO_3$), vanadium pentoxide ($V_2O_5$), nickel oxide (NiO), polyethyleneimine (PEI), zirconium dioxide ($ZrO_3$), zinc oxide (ZnO), titanium dioxide ($TiO_2$), tin oxide ($SnO_2$), bathocuproine (BCP), C60, or derivatives thereof.

14. The method of claim 12, wherein depositing a hole transport layer or an electron transport layer in step (b) or (d) comprises vacuum evaporation, electron-beam evaporation, magnetron sputtering, atomic layer deposition, photoetching, chemical vapor deposition, screen printing, hydrothermal process, electrochemical deposition, spin-coating, blade-coating, bar coating, slot-die coating, spray coating or ink-jet printing.

* * * * *